(12) United States Patent
Liang et al.

(10) Patent No.: US 8,748,533 B2
(45) Date of Patent: Jun. 10, 2014

(54) CURABLE ORGANOPOLYSILOXANE COMPOSITION AND METHOD FOR MANUFACTURING THE SAME

(75) Inventors: Kwei-Wen Liang, Kaohsiung (TW); Chih-Chiang Yang, Kaohsiung (TW)

(73) Assignee: Eternal Chemical Co., Ltd., Kaohsiung (TW)

( * ) Notice: Subject to any disclaimer, the term of this patent is extended or adjusted under 35 U.S.C. 154(b) by 64 days.

(21) Appl. No.: 13/302,512

(22) Filed: Nov. 22, 2011

(65) Prior Publication Data
US 2012/0172544 A1  Jul. 5, 2012

(30) Foreign Application Priority Data
Dec. 31, 2010 (TW) ................................. 99147298 A

(51) Int. Cl.
*C08G 77/50* (2006.01)
*C08F 283/12* (2006.01)
*C08L 83/07* (2006.01)

(52) U.S. Cl.
USPC ............................... 525/35; 525/474; 525/478

(58) Field of Classification Search
USPC ..................................... 528/35; 525/474, 478
See application file for complete search history.

(56) References Cited

U.S. PATENT DOCUMENTS

| | | | | |
|---|---|---|---|---|
| 3,192,181 A | * | 6/1965 | Moore | 528/15 |
| 4,886,865 A | * | 12/1989 | Ikeno et al. | 528/15 |
| 5,239,034 A | * | 8/1993 | Takago et al. | 528/15 |
| 5,247,046 A | * | 9/1993 | Takago et al. | 528/15 |
| 6,034,225 A | * | 3/2000 | Weidner et al. | 534/730 |
| 6,764,717 B2 | * | 7/2004 | Herzig et al. | 427/387 |
| 6,797,742 B2 | * | 9/2004 | Kilgour et al. | 523/107 |
| 6,841,647 B2 | * | 1/2005 | Walker et al. | 528/31 |
| 7,238,755 B2 | * | 7/2007 | Herzig et al. | 525/477 |
| 7,282,270 B2 | | 10/2007 | Morita et al. | |
| 7,423,107 B2 | * | 9/2008 | Ootake et al. | 528/31 |
| 7,527,871 B2 | | 5/2009 | Morita et al. | |
| 7,687,587 B2 | * | 3/2010 | Smith et al. | 525/478 |
| 8,173,759 B2 | * | 5/2012 | Kashiwagi et al. | 528/35 |

FOREIGN PATENT DOCUMENTS

| | | |
|---|---|---|
| JP | 8-176447 | 7/1996 |
| JP | 2003-128922 | 5/2003 |
| WO | WO 93/23455 | 11/1993 |
| WO | WO 97/23548 | 7/1997 |

OTHER PUBLICATIONS

Noll, Walter. "Chemistry and Technology of Silicones". Academic Press, New York.*

* cited by examiner

*Primary Examiner* — Mike M Dollinger
(74) *Attorney, Agent, or Firm* — Greer, Burns & Crain, Ltd.

(57) ABSTRACT

A curable organopolysiloxane composition comprises the following: (A) an organopolysiloxane having at least two silicon-bonded alkenyl groups and having an average unit formula (I): $(R^1_2SiO_{2/2})_a(R^2_3SiO_{1/2})_b(R^3SiO_{3/2})_c(SiO_{4/2})_d(CH_2CH_2)_e$; (B) a branched organopolysiloxane having at least one silicon-bonded alkenyl group and having a siloxane unit of formula $R^4SiO_{3/2}$; (C) an organopolysiloxane having an average unit formula (II) being capped with H: $(R^5_2SiO_{2/2})_f(R^6_3SiO_{1/2})_g(R^7SiO_{3/2})_h(SiO_{4/2})_i(CH_2CH_2)_j$; and (D) a catalyst, wherein $R^1$ to $R^7$ and a to j are as defined in the specification.

19 Claims, No Drawings

CURABLE ORGANOPOLYSILOXANE COMPOSITION AND METHOD FOR MANUFACTURING THE SAME

This application claims the benefit of Taiwan Application Serial No. 099147298, filed Dec. 31, 2010, the subject matter of which is incorporated herein by reference.

CROSS-REFERENCES TO RELATED APPLICATIONS

Not applicable.

BACKGROUND OF THE INVENTION

1. Field of the Invention

The present invention relates to a curable organopolysiloxane composition. In particular, the present invention relates to a curable organopolysiloxane composition, which is suitable for use as the packaging material of electronic components such as light emitting diodes.

2. Descriptions of the Related Art

Organic resin, due to its properties of high processability, light weight, low cost and impact resistance etc., has gradually replaced inorganic glass for use as optical components such as optical lens and packaging materials of electronic components. Recently, due to the development of light emitting diode techniques (e.g., high brightness, multiple color property etc.), organic silicon resins which have better heat resistance, water resistance and transparency, have gradually replaced epoxy resins for use as the packaging material of electronic components.

An organic silicon resin, i.e., organopolysiloxane, can be cured through alkylation with silicon hydrides. The cured solid product of the alkylation has a high refractive index and transmittance, and can be used as the packaging material of a light emitting diode. For example, JP H8-176447 discloses a curable organopolysiloxane composition, comprising an organopolysiloxane in which each molecule has a silicon-bonded phenyl group and an silicon-bonded alkenyl group, an organic hydrogen siloxane, and an alkylation catalyst; and JP 2003-128922 discloses a curable organopolysiloxane composition, comprising an organopolysiloxane in which each molecule has at least two silicon-bonded alkenyl groups and a silicon-bonded phenyl group, an organopolysiloxane in which each molecule has at least two silicon-bonded H, and an alkylation catalyst. Such curable organopolysiloxane compositions, due to their high viscosities, have disadvantages including operation difficulty and poor adhesive property to the substrate.

U.S. Pat. No. 7,527,871 B2 discloses a modified curable organopolysiloxane composition, in comparison to the above prior arts, which comprises a component of a linear organopolysiloxane with at least two silicon-bonded alkenyl groups and at least one aryl group and thus, can provide a cured product with a low viscosity and well adhesive property. However, during the synthesis of the above component, a great amount of nonreactive residue of methyl phenyl rings is inevitably generated for the reaction equilibrium, which will make the surface of the cured product obtained from the composition sticky. In addition, any procedure used to remove the rings, such as a high-temperature distillation, will probably lead to the breakage of the bonding between the phenyl groups and result in the appearance of yellowing. Furthermore, since the added component is a linear organopolysiloxane with insufficient strength, the cured product will tend to fracture under a high temperature or a drastic temperature variation.

In view of the above, the present invention provides a curable organopolysiloxane composition without any undesired residue of rings during the manufacturing process. The cured product of the composition has outstanding heat resistance, transmittance as well as refractive index, and the yellowing barely occurs during the high temperature curing process of the composition. In addition, the composition ratio or structure of the curable organopolysiloxane composition can be adjusted to satisfy the demands of a quick curing process and to change the structure of the product.

SUMMARY OF THE INVENTION

An objective of the present invention is to provide a curable organopolysiloxane composition comprising:

(A) an organopolysiloxane having at least two silicon-bonded alkenyl groups and having an average unit formula (I):

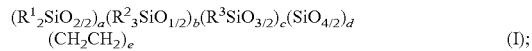

$(R^1_2SiO_{2/2})_a(R^2_3SiO_{1/2})_b(R^3SiO_{3/2})_c(SiO_{4/2})_d(CH_2CH_2)_e$ (I);

wherein $R^1$, $R^2$ and $R^3$ are independently a substituted or unsubstituted mono-valent hydrocarbon group, each of $R^1$ is the same with or different from each other, each of $R^2$ is the same with or different from each other, and a>0, b>0, c≥0, d≥0, and e>0;

(B) a branched organopolysiloxane having at least one silicon-bonded alkenyl group and having a siloxane unit of formula $R^4SiO_{3/2}$ wherein $R^4$ is a substituted or unsubstituted mono-valent hydrocarbon group, and wherein the amount of component (B) is about 1 part by weight to about 9900 parts by weight, based on 100 parts by weight of component (A);

(C) an organopolysiloxane having an average unit formula (II) being capped with H:

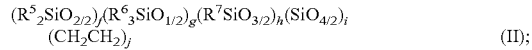

$(R^5_2SiO_{2/2})_f(R^6_3SiO_{1/2})_g(R^7SiO_{3/2})_h(SiO_{4/2})_i(CH_2CH_2)_j$ (II);

wherein $R^5$, $R^6$ and $R^7$ are independently H or a substituted or unsubstituted mono-valent hydrocarbon group, wherein each of $R^5$ is the same with or different from each other, each of $R^6$ is the same with or different from each other, f>0, g>0, h≥0, i≥0, j≥0, and the amount of component (C) is about 1 parts by weight to about 300 parts by weight, based on 100 parts by weight of the total amount of components (A) and (B); and (D) a catalyst.

Another objective of the present invention is to provide a method for manufacturing the above curable organopolysiloxane composition, comprising performing an addition reaction of a siloxane having at least two alkenyl groups and a siloxane having at least two H to provide component (A).

The above curable organopolysiloxane composition according to the invention can be used as the packaging material of a light emitting diode.

The detailed technology and preferred embodiments implemented for the subject invention are described in the following paragraphs for people skilled in this field to well appreciate the features of the claimed invention.

DESCRIPTION OF THE PREFERRED EMBODIMENT

Hereinafter, some embodiments of the present invention will be described in detail. However, the present invention may also be practiced in various different forms without departing from the spirits of the present invention. The scope of the present invention shall not be considered to be limited to what is illustrated herein. In addition, unless it is additionally explained, the expressions "a," "the," or the like recited in the specification (especially in the claims) should include the singular and the plural forms. Furthermore, unless it is additionally explained, the groups (e.g., a mono-valent hydrocarbon group, an alkyl group, an aryl group and an alkenyl group) recited in the specification should include substituted or unsubstituted groups.

One feature of the curable organopolysiloxane composition of the invention is the use of component (A). There is no residue of rings with low molecular weight, such as methyl phenyl rings, during the preparation of component (A), therefore the cured product of the curable organopolysiloxane composition of the invention has advantages of including an unsticky surface and rarely generating yellowing when being cured at a high temperature.

Specifically, the curable organopolysiloxane composition of the invention comprises:

(A) an organopolysiloxane having at least two silicon-bonded alkenyl groups and having an average unit formula (I):

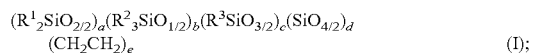

$$(R^1_2SiO_{2/2})_a(R^2_3SiO_{1/2})_b(R^3SiO_{3/2})_c(SiO_{4/2})_d(CH_2CH_2)_e \quad (I);$$

wherein $R^1$, $R^2$ and $R^3$ are independently a substituted or unsubstituted mono-valent hydrocarbon group, each of $R^1$ is the same with or different from each other, each of $R^2$ is the same with or different from each other, and a>0, b>0, c≥0, d≥0, and e>0;

(B) a branched organopolysiloxane having at least one silicon-bonded alkenyl group and having a siloxane unit of formula $R^4SiO_{3/2}$ wherein $R^4$ is a substituted or unsubstituted mono-valent hydrocarbon group;

(C) an organopolysiloxane having an average unit formula (II) being capped with H:

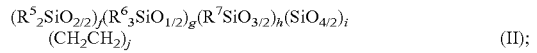

$$(R^5_2SiO_{2/2})_f(R^6_3SiO_{1/2})_g(R^7SiO_{3/2})_h(SiO_{4/2})_i(CH_2CH_2)_j \quad (II);$$

wherein $R^5$, $R^6$ and $R^7$ are independently H or a substituted or unsubstituted mono-valent hydrocarbon group, wherein each of $R^5$ is the same with or different from each other, each of $R^6$ is the same with or different from each other, f>0, g>0, h≥0, i≥0, and j≥0; and (D) a catalyst.

Component (A) is an organopolysiloxane having at least two silicon-bonded alkenyl groups such as alkenyl groups with 2 to 20 carbon atoms, preferably with 2 to 12 carbon atoms, and more preferably with 2 to 6 carbon atoms. The examples of alkenyl groups include, but not limited to, vinyl groups, allyl groups, butenyl groups, pentenyl groups and hexenyl groups. To keep a low viscosity of the organopolysiloxane composition, the preferred alkenyl groups are vinyl groups with low molecular weights. In addition to the two silicon-bonded alkenyl groups, component (A) further has a substituted or unsubstituted mono-valent hydrocarbon group. In other words, in the average unit formula of component (A), $R^1$, $R^2$ and $R^3$ are independently substituted or unsubstituted mono-valent hydrocarbon groups such as substituted or unsubstituted alkyl groups with 1 to 20 carbon atoms, preferably with 1 to 12 carbon atoms, and more preferably with 1 to 8 carbon atoms, e.g., a methyl group, an ethyl group, a propyl group, a butyl group, a pentyl group, a hexyl group or a heptyl group; substituted or unsubstituted alkenyl group with 2 to 20 carbon atoms, preferably with 2 to 12 carbon atoms, more preferably with 2 to 6 carbon atoms, e.g., a vinyl group, an allyl group, a butenyl group, a pentenyl group or a hexenyl group; aryl groups with 6 to 14 carbon atoms, e.g., phenyl group, a tolyl group, a xylyl group or a naphthyl group; arylalkyl groups with 7 to 15 carbon atoms, e.g., a benzyl group or a phenylethyl group; or halogenated alkyl groups with 1 to 20 carbon atoms, preferably with 1 to 12 carbon atoms, and more preferably with 1 to 8 carbon atoms, e.g., 3-chloropropyl group or 3,3,3-trifluoropropyl group.

According to the invention, there is no special limitation on the molecular weight of component (A). However, in view of the viscosity of the whole composition, b, c, d and e are preferably as follows:

a is an integer ranging from about 1 to about 200;
b is an integer ranging from about 1 to about 200;
c is an integer ranging from 0 to about 10;
d is an integer ranging from 0 to about 5; and
e is an integer ranging from about 1 to about 100, wherein, when c+d>0 (i.e., component (A) has a branched-chain structure), the cured product of the curable organopolysiloxane composition of the invention has better mechanical strength.

For example, component (A) may be selected from the following group:

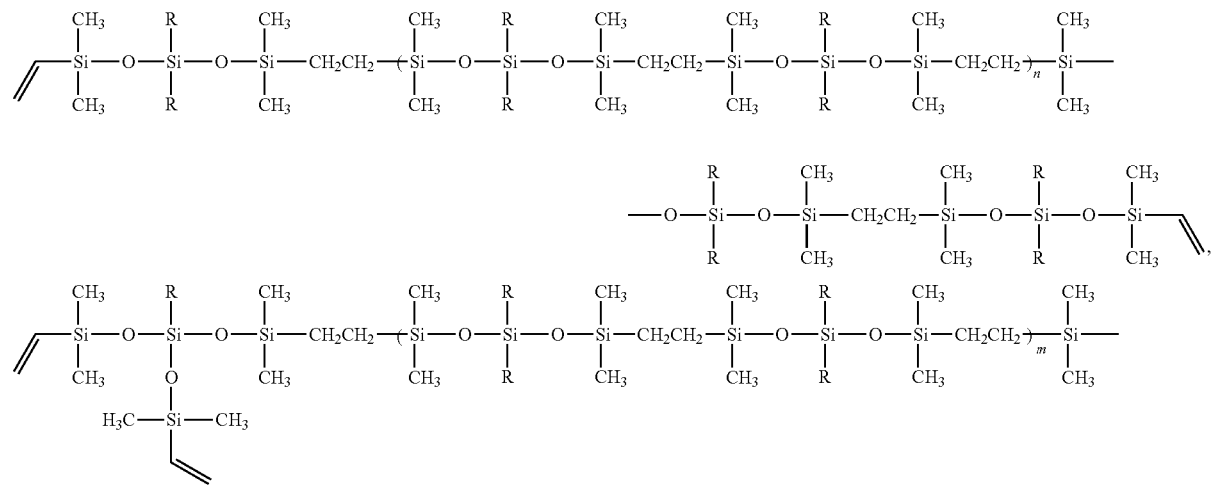

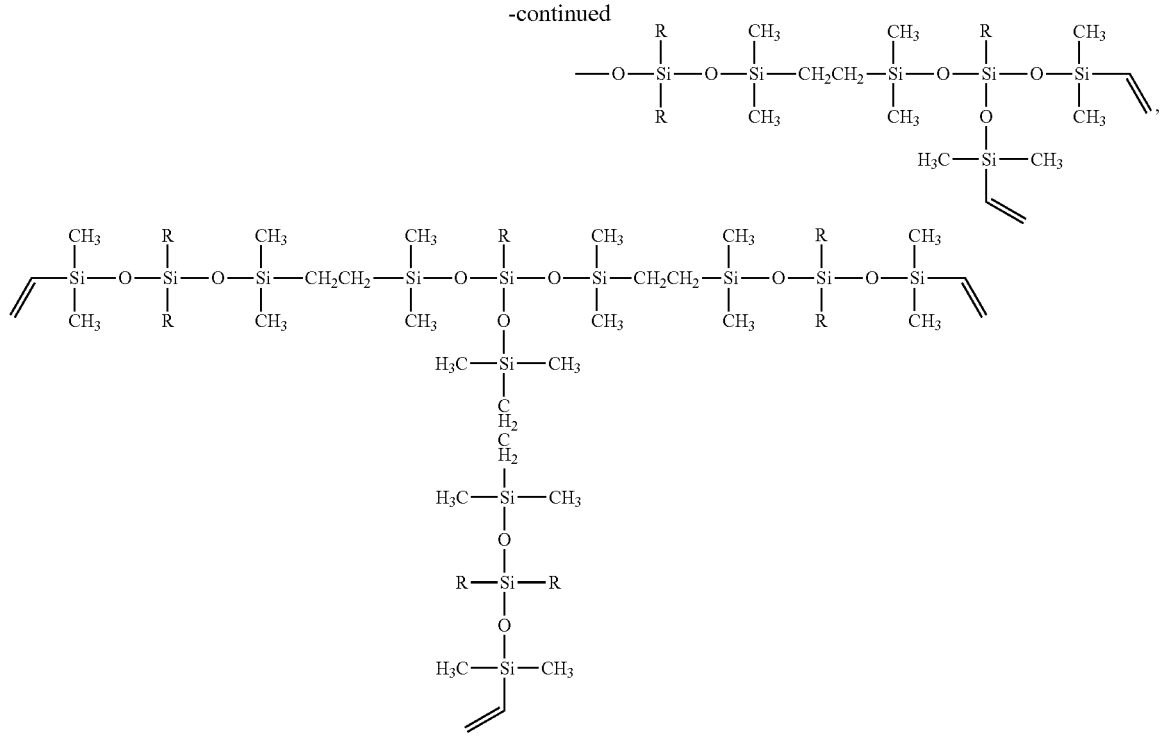
and combinations thereof,
wherein each of R is independently an alkyl group or aryl group, and m and n are independently integers ranging from about 1 to about 50; and preferably, each of R is independently an alkyl group or phenyl group with 1 to 8 carbon atoms. In some embodiments of the invention, component (A) is
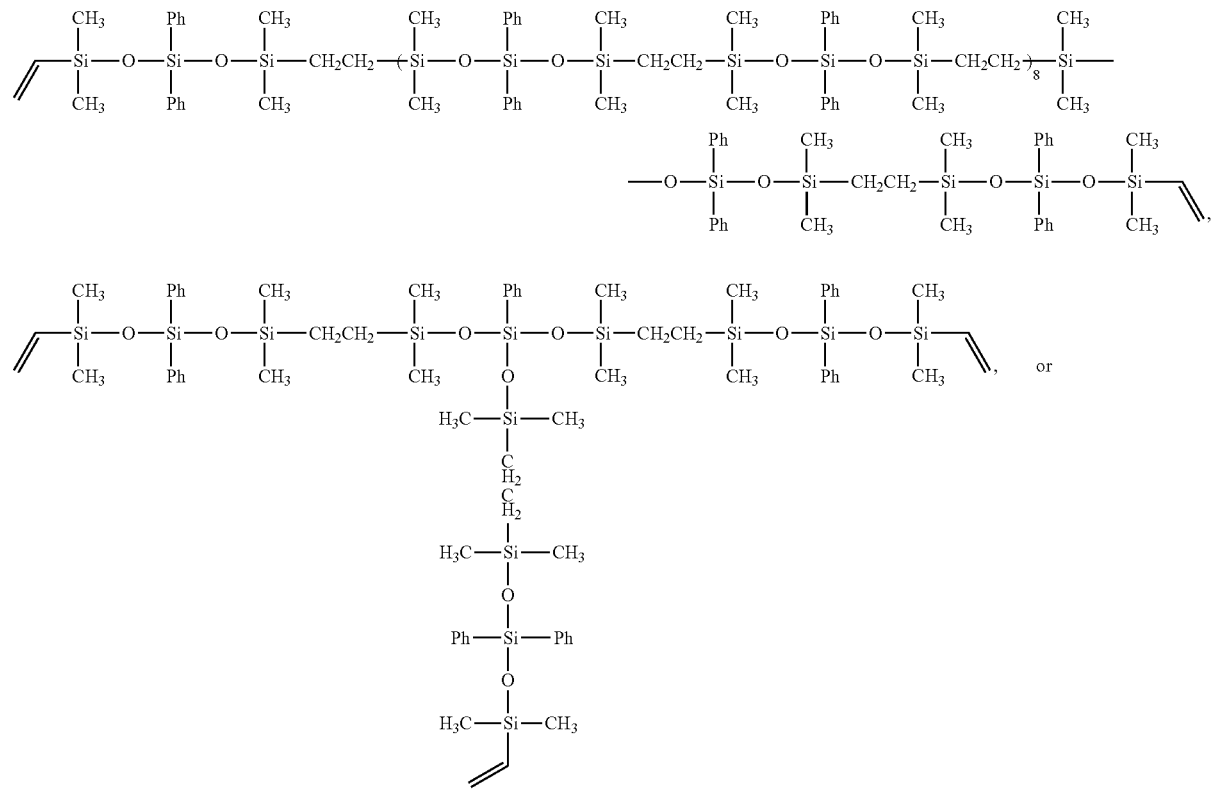

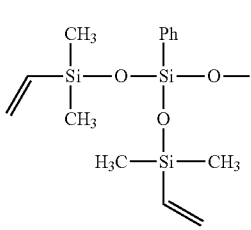
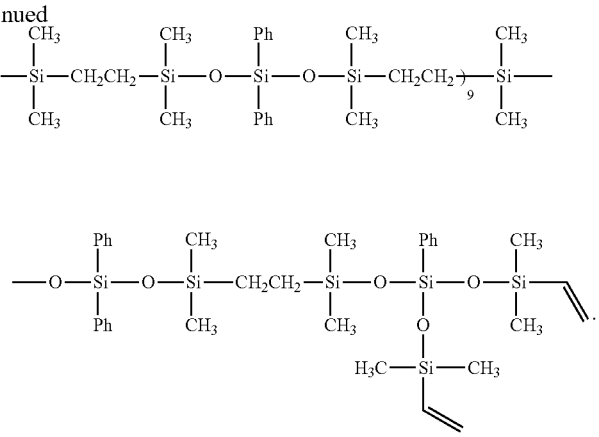

According to the invention, component (A) can be prepared by an addition reaction of a siloxane having at least two alkenyl groups and a siloxane having at least two H. During preparation, there is no residue of rings with low molecular such as methyl phenyl rings, therefore the cured product of the curable organopolysiloxane composition of the invention does not have disadvantages associated with the residue of rings with low molecular (such as a sticky surface and yellowing) and is thus, very suitable for use as an optical material. The siloxane having at least two alkenyl groups, for example, can be the one having an average unit formula (III):

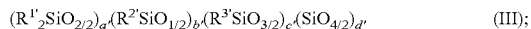

and the siloxane having at least two H can be, for example, one having an average unit formula (IV):

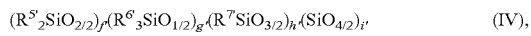

wherein $R^{1'}$, $R^{2'}$, $R^{3'}$, $R^{4'}$, $R^{5'}$, $R^{6'}$ and $R^{7'}$ are independently substituted or unsubstituted mono-valent hydrocarbon groups such as alkyl, alkenyl, aryl, arylalkyl or halogenated as mentioned above; each $R^{1'}$ is the same as or different from each other; each $R^{2'}$ is the same as or different from each other; each $R^{5'}$ is the same as or different from each other, each of $R^{6'}$ is the same as or different from each other; and $a'>0$, $b'>0$, $c'\geq 0$, $d'\geq 0$, $f'>0$, $g'>0$, $h'\geq 0$ and The structure and molecular weight of component (A) can be adjusted by choosing different siloxanes having at least two alkenyl groups or siloxanes having at least two H. For example, the structure of component (A) (e.g., a linear, branched or reticulated structure) can be adjusted by using a linear or branched siloxane having at least two alkenyl groups or a linear or branched siloxane having at least two H. The molecular weight of component (A) can be adjusted by using siloxane having at least two alkenyl groups or siloxane having at least two H with different molecular weights, depending on the needs (such as a desired curing rate or mechanical strength).

Based on the total amount of $R^1$, $R^2$ and $R^3$, preferably about 0.1 percent by mole to about 40 percent by mole of $R^1$, $R^2$ and $R^3$ and more preferably about 0.3 percent by mole to about 30 percent by mole of $R^1$, $R^2$ and $R^3$ are alkenyl groups. The reactivity of component (A) with the other components tends to decrease when the content of alkenyl groups is lower than the lower limit of the suggested range or higher than the upper limit of the suggested range. Furthermore, to increase the refractive index of the cured product, preferably at least about 10 percent by mole of $R^1$, $R^2$ and $R^3$ and more preferably at least about 20 percent by mole of $R^1$, $R^2$ and $R^3$ are aryl groups, based on the total amount of $R^1$, $R^2$ and $R^3$. In some embodiments of the invention, component (A) is prepared by carrying out the addition reaction by using

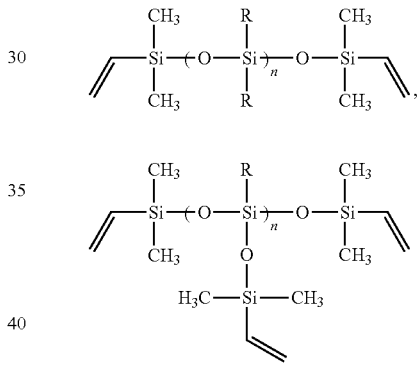

or combinations thereof as the siloxane having at least two alkenyl groups (n' is an integer ranging from about 1 to about 5), and using

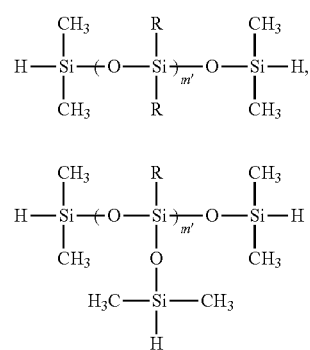

or combinations thereof as the siloxane having at least two H (m' is an integer ranging from about 1 to about 5) in a molar ratio of about 2:1 to about 50:49. For example, component (A)

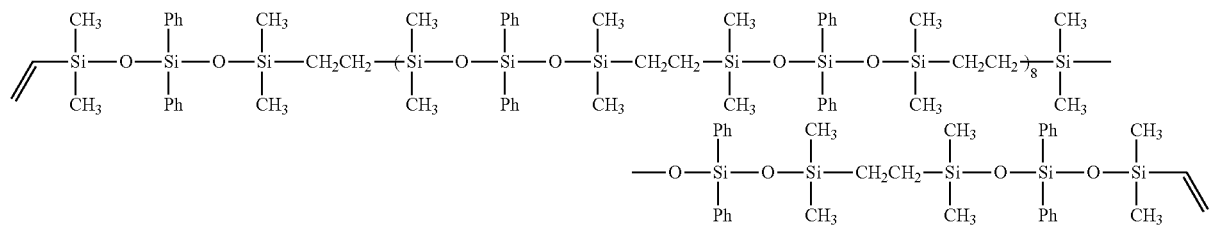

can be prepared by carrying out an addition reaction of CH$_2$=CH(CH$_3$)$_2$SiO[(C$_6$H$_5$)$_2$Si]OSi(CH$_3$)$_2$CH=CH$_2$ and H(CH$_3$)$_2$SiO[(C$_6$H$_5$)$_2$Si]OSi(CH$_3$)$_2$H in a molar ratio of about 10:9.

Component (B) is a branched organopolysiloxane having at least one silicon-bonded alkenyl group, which is a major component that gives strength to the cured product of the curable organopolysiloxane composition of the invention. The alkenyl group of component (B) may be, for example, the groups mentioned above, and is preferably a vinyl group with low molecular weight. In addition to the silicon-bonded alkenyl group, component (B) further comprises a substituted or unsubstituted mono-valent hydrocarbon group. In other words, in the average unit formula of component (B), $R^4$ can be an alkyl group, an alkenyl group, an aryl group, an arylalkyl group or a halogenated alkyl group as mentioned above.

According to the embodiment of the invention, the branched organopolysiloxane of component (B) has at least one silicon-bonded alkenyl group and at least one silicon-bonded aryl group. In one specific example of the invention, component (B) has an average unit formula (V):

$$(R^4SiO_{3/2})_k[(CH_2=CH)(R^8)_2SiO_{1/2}]_{1-k} \quad (V),$$

wherein $R^4$ is as defined above, $R^8$ is independently a substituted or unsubstituted mono-valent hydrocarbon group such as an alkyl group, alkenyl group, aryl group, arylalkyl group or halogenated group as mentioned above; each of $R^8$ is the same as or different from each other, and k ranges from about 0.5 to about 0.95. Preferably, $R^4$ is an aryl group, $R^8$ is independently an alkyl group with 1 to 8 carbon atoms, and k ranges from about 0.6 to about 0.9. In some embodiments of the invention, component (B) is $(C_6H_5SiO_{3/2})_{0.8}[(CH_2=CH)(CH_3)_2SiO_{1/2}]_{0.2}$.

Component (B) is preferred to have about 0.1 percent by mole to about 40 percent by mole, and more preferably about 0.3 percent by mole to about 35 percent by mole, of alkenyl groups as $R^4$, based on the total amount of $R^4$. The reactivity of component (B) with other components tends to decrease when the content of alkenyl groups is lower than the lower limit of the suggested range or higher than the upper limit of the suggested range. Furthermore, to increase the refractive index of the cured product, preferably at least about 10 percent by mole, more preferably at least about 20 percent by mole, of $R^4$ are aryl groups, based on the total amount of $R^4$.

Among the curable organopolysiloxane composition of the invention, the amount of component (B) is about 1 part by weight to about 9900 parts by weight, preferably about 200 part by weight to about 3000 parts by weight and more preferably about 300 part by weight to about 2500 parts by weight, based on 100 parts by weight of component (A). The mechanical strength of the cured product of the curable organopolysiloxane composition will be insufficient if the amount of component (B) is lower than the lower limit of the suggested range. In addition, the cured product of the curable organopolysiloxane composition will become too hard and its applicability scope will be limited if the amount of component (B) is higher than the upper limit of the suggested range.

Component (C) is an organopolysiloxane having an average unit formula (II) being capped with H:

$$(R^5{}_2SiO_{2/2})_f(R^6{}_3SiO_{1/2})_g(R^7SiO_{3/2})_h(SiO_{4/2})_i(CH_2CH_2)_j \quad (II),$$

which is the curing agent of the curable organopolysiloxane composition of the invention. $R^5$, $R^6$ and $R^7$ are independently H or a substituted or unsubstituted mono-valent hydrocarbon group except alkenyl groups, such as an alkyl group, an aryl group, an arylalkyl group, or a halogenated alkyl group as mentioned above. Furthermore, to increase the refractive index of the cured product, based on the total amount of $R^5$, $R^6$ and $R^7$, preferably about 0.1 percent by mole to about 50 percent by mole of $R^5$, $R^6$ and $R^7$ are H and at least about 5 percent by mole are aryl groups, and more preferably about 5 percent by mole to about 35 percent by mole of $R^5$, $R^6$ and $R^7$ are H and at least about 10 percent by mole are aryl groups.

Furthermore, according to the invention, there is no special limitation on the molecular weight of component (C). However, in view of the viscosity of the whole composition, f, g, h, i and j are preferably as follows:

f is an integer ranging from about 1 to about 50;
g is an integer ranging from about 1 to about 50;
h is an integer ranging from 0 to about 10;
i is an integer ranging from 0 to about 5; and
j is an integer ranging from 0 to about 30.

Component (C) may be selected from the following group:

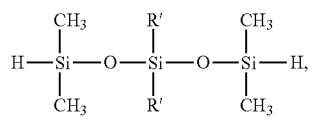

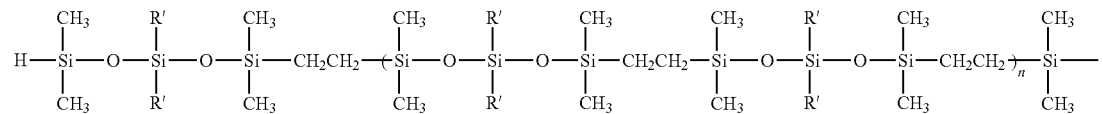

-continued

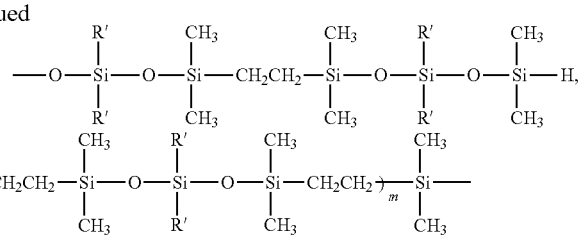

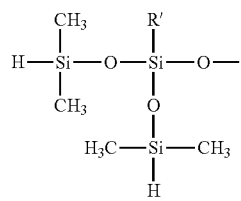

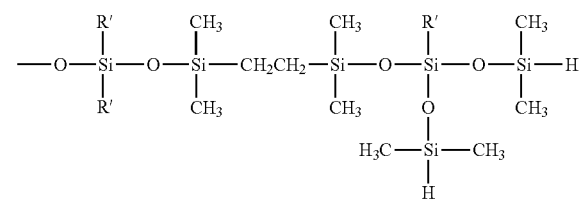

and combinations thereof,
wherein each R' is independently an alkyl group or aryl group, and m" and n" are independently an integer ranging from 0 to about 30; and preferably, each R' is independently an alkyl group or a phenyl group with 1 to 8 carbon atoms, and m" and n" are independently an integer ranging from 0 to about 15. In some embodiments of the invention, component (C) is $H(CH_3)_2SiO[(C_6H_5)_2Si]OSi(CH_3)_2H$,

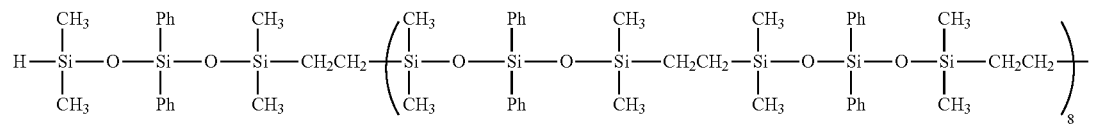

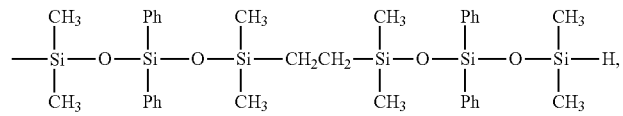

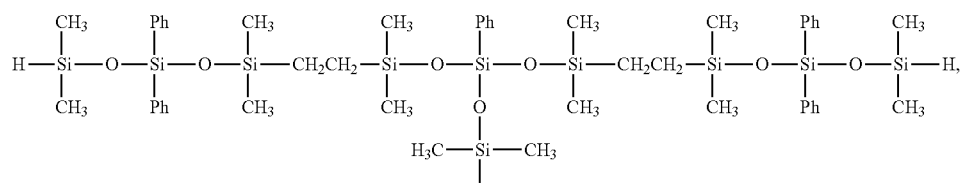

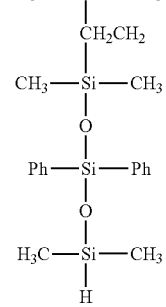

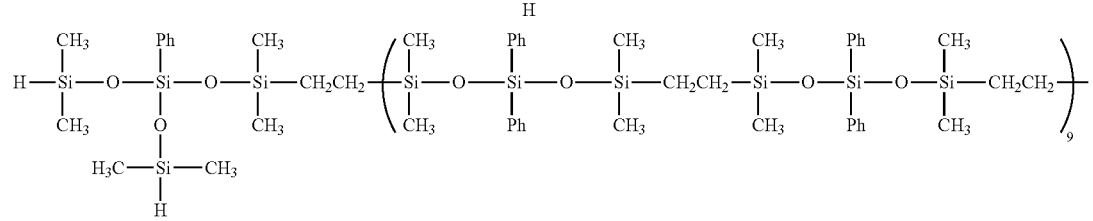

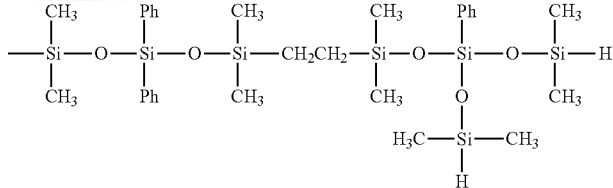

or a combination thereof.

Among the curable organopolysiloxane compositions of the invention, the amount of component (C) is about 1 part by weight to about 300 parts by weight, preferably about 10 parts by weight to about 250 parts by weight and more preferably about 15 parts by weight to about 200 parts by weight, based on 100 parts by weight of the total amount of components (A) and (B). If the amount of component (C) is lower than the lower limit of the suggested range, the composition may not be cured sufficiently; and if the amount of component (C) is higher than the upper limit of the suggested range, the heat resistance of the cured product of the composition tends to decrease.

Component (D) is a catalyst to promote the curing of the composition, which catalyzes the reaction between the alkenyl groups of components (A) and (B) and the silicon-bonded H of component (C). The catalyst may be selected from the following group: Pt, Rh, Pd, compounds and complexes of the above, and combinations thereof, and is preferably a Pt catalyst. The embodiments of the Pt catalyst are, for example, Pt powders, chloroplatinic acid, an alcohol solution of chloroplatinic acid, Pt/alkenyl-siloxane complexes, Pt/alkene complexes and Pt/carbonyl complexes, wherein the Pt/alkenyl-siloxane complexes are preferred. Furthermore, there is no limitation on the amount of component (D) as long as component (D) can provide the desired promoting effect for the curing of the composition. Generally, the amount of component (D) is about 0.01 ppm to about 500 ppm, and preferably about 0.01 ppm to about 100 ppm, based on the metal amount contained in component (D). If the amount of component (D) is lower than the lower limit of the suggested range, the catalyst cannot provide the desired catalytic effect and the composition may not be cured sufficiently; and if the amount of component (D) is higher than the upper limit of the suggested range, the cured product of the composition may be provided with undesired color.

Furthermore, under the premise of not damaging the objective of the invention, other curing agents and/or additives (e.g., adhesion promoters, inorganic fillers, heat stabilizers, pigments, flame retardants and solvents) may be added into the curable organopolysiloxane composition of the invention. The relevant disclosure and specific embodiments can refer to U.S. Pat. No. 7,527,871 B2, and the full content of which is incorporated herein for reference.

The curable organopolysiloxane composition of the invention can be cured to provide a cured product with a low viscosity, good operation ability, a high refractive index (>1.50), and a high transmittance without yellowing. Thus, the curable organopolysiloxane composition of the invention is suitable for use as a packaging material of light emitting diodes.

The present invention further provides a method for manufacturing the above curable organopolysiloxane composition. The method comprises an addition reaction of a siloxane having at least two alkenyl groups and a siloxane having at least two H to provide component (A); and mixing component (A) with the above components (B), (C) and (D) and other desired additives. Persons with ordinary skill in the art can easily comprehend and carry out the method after reviewing the disclosure of the specification and there is no need to further describes the detailed process of the method here.

The present invention will be further illustrated by the embodiments hereinafter, wherein the measuring instruments and methods are respectively as follows:

<Refractive Index of the Cured Product>

The refractive index of the sample was measured by Abbe refractometer of ATAGO company (light source: a visible light with a wavelength of 589 nm) at 25° C.

<Transmittance of the Cured Product>

The transmittance of the sample was measured by Lambda 650 instrument of Perkin Elmer company (light source: a visible light with a wavelength of 450 nm; optical path length: about 1 mm).

<Hardness of the Cured Product>

The hardness of the sample was measured by Shore durometer (model no.: GS-720N and GS-709G) of the TECLOCK company.

EXAMPLES

Preparation of Component (A)

1.0 mol of CH$_2$=CH(CH$_3$)$_2$SiO[(C$_6$H$_5$)$_2$Si]OSi(CH$_3$)$_2$CH=CH$_2$ was mixed with 0.9 mol of H(CH$_3$)$_2$SiO[(C$_6$H$_5$)$_2$Si]OSi(CH$_3$)$_2$H and a Pt metal catalyst was added into the resultant mixture to carry out an addition reaction. Component (A) (viscosity: 8,147 mPa·sec) was obtained:

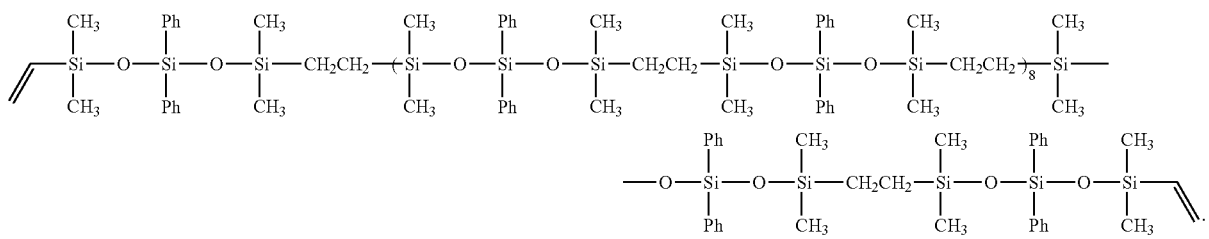

Preparation of Component (A-1)

0.3 mol of $CH_2=CH(CH_3)_2SiO[(C_6H_5)_2Si]OSi(CH_3)_2CH=CH_2$ was mixed with 0.1 mol of $H(CH_3)_2SiO[(C_6H_5)_2SiOSi(CH_3)_2]OSi(CH_3)_2H$ and a Pt metal catalyst was added into the resultant mixture to carry out an addition reaction. Component (A-1) (viscosity: 248 mPa·sec) was obtained:

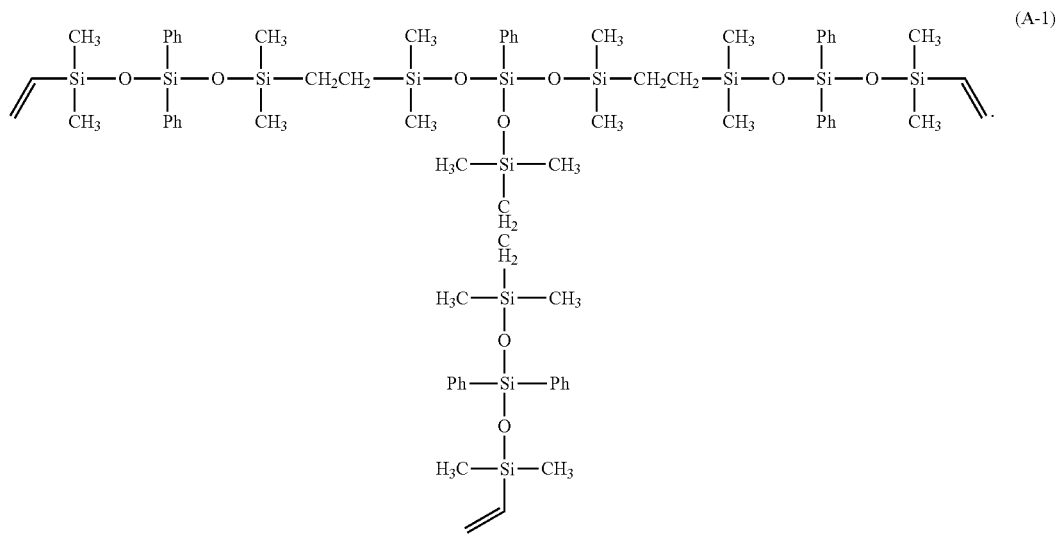

(A-1)

Preparation of Component (A-2)

0.9 mol of $CH_2=CH(CH_3)_2SiO[(C_6H_5)_2Si]OSi(CH_3)_2CH=CH_2$ was mixed with 1.0 mol of $H(CH_3)_2SiO[(C_6H_5)_2Si]OSi(CH_3)_2H$ and a Pt metal catalyst was added into the resultant mixture to carry out an addition reaction. After the reaction, 0.2 mol of $CH_2=CH(CH_3)_2SiO[(C_6H_5)SiOSi(CH_3)_2CH=CH_2]OSi(CH_3)_2CH=CH_2$ was added into the product mixture to carry out an addition reaction. Component (A-2) (viscosity: 7,594 mPa·sec) was obtained:

Preparation of Component (C-1)

0.9 mol of $CH_2=CH(CH_3)_2SiO[(C_6H_5)_2Si]OSi(CH_3)_2CH=CH_2$ was mixed with 1.0 mol of $H(CH_3)_2SiO[(C_6H_5)_2Si]OSi(CH_3)_2H$ and a Pt metal catalyst was added into the resultant mixture to carry out an addition reaction. Component (C-1) (viscosity: 5,758 mPa·sec) was obtained:

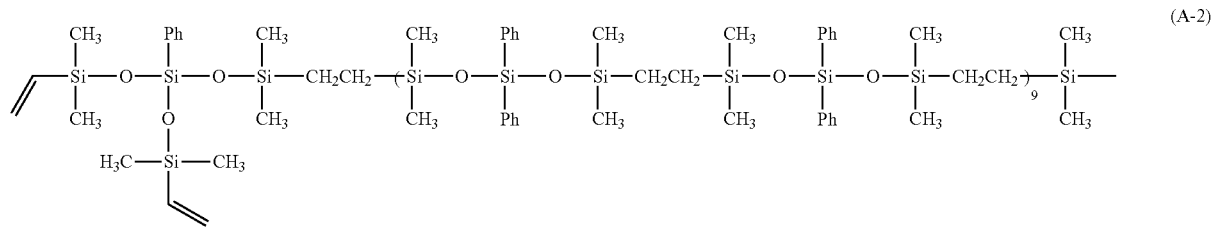

(A-2)

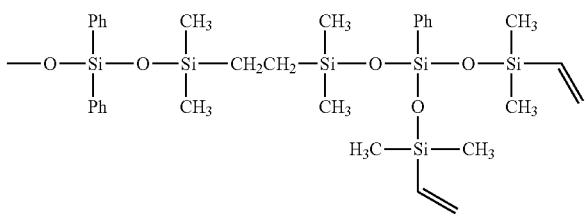

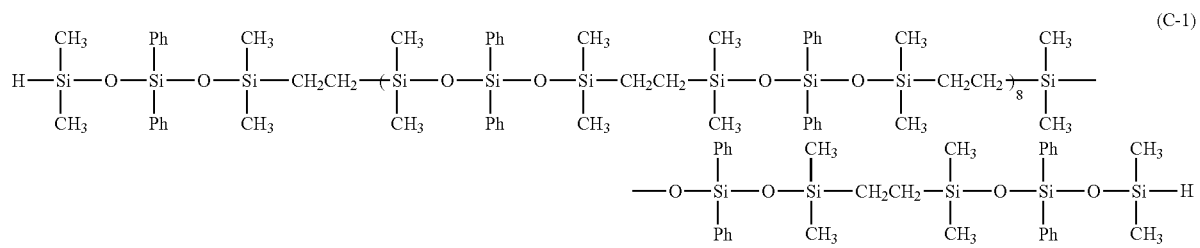

(C-1)

Preparation of Component (C-2)

0.1 mol of $CH_2=CH(CH_3)_2SiO[(C_6H_5)_2Si]OSi(CH_3)_2CH=CH_2$ was mixed with 0.3 mol of $H(CH_3)_2SiO[(C_6H_5)SiOSi(CH_3)_2H]OSi(CH_3)_2H$ and a Pt metal catalyst was added into the resultant mixture to carry out an addition reaction. Component (C-2) (viscosity: 372 mPa·sec) was obtained:

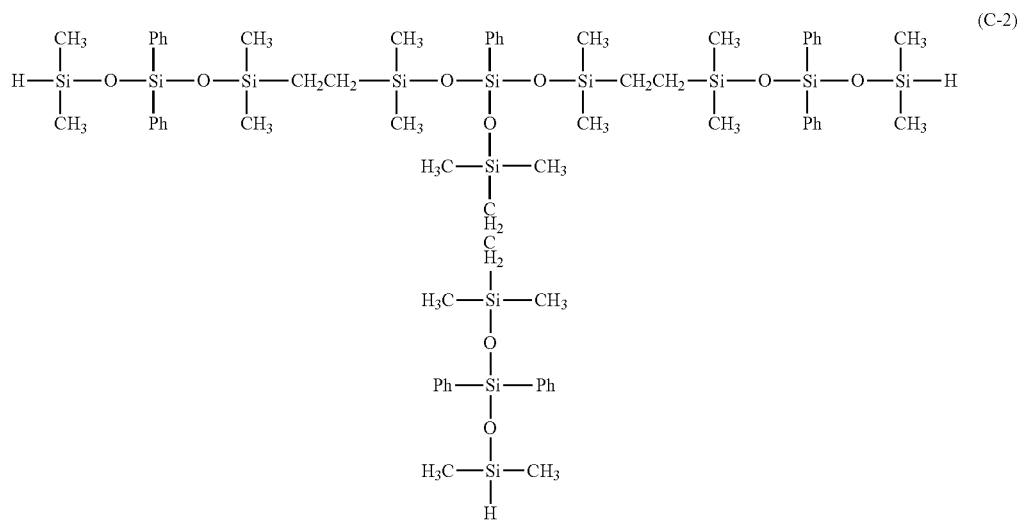

(C-2)

Preparation of Component (C-3)

1.0 mol of $CH_2=CH(CH_3)_2SiO[(C_6H_5)_2Si]OSi(CH_3)_2CH=CH_2$ was mixed with 0.9 mol of $H(CH_3)_2SiO[(C_6H_5)Si]OSi(CH_3)_2H$ and a Pt metal catalyst was added into the resultant mixture carry out an addition reaction. After the reaction, 0.2 mol of $H(CH_3)_2SiO[(C_6H_5)SiOSi(CH_3)_2H]OSi(CH_3)_2H$ was added into the mixture to carry out an addition reaction. Component (C-3) (viscosity: 7,512 mPa·sec) was obtained:

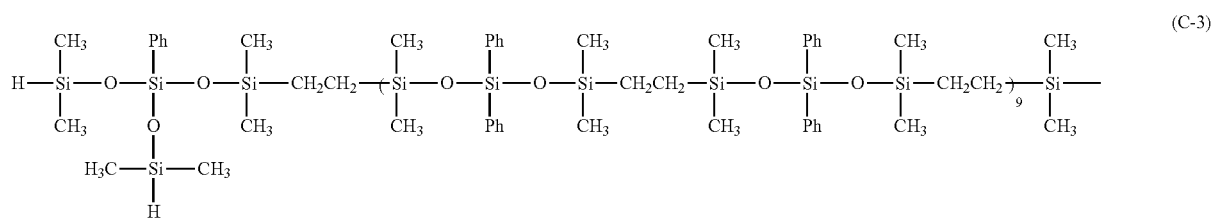

(C-3)

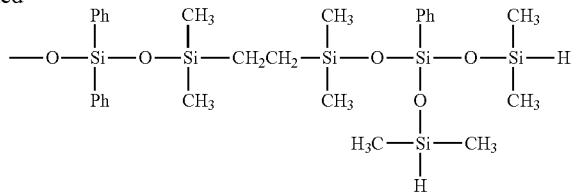

Example 1

The obtained component (A) was mixed with the following components to prepare a curable organopolysiloxane composition 1 (viscosity: 2,824 mPa·sec):

component (A): 7 parts by weight;
component (B): an organopolysiloxane (65 parts by weight; solid at 25° C.) with an average molecular weight of 1,729, a silicon-bonded phenyl group content of 57% by mole, a silicon-bonded vinyl group content of 4.07% by weight, and the following structure: $(C_6H_5SiO_{3/2})_{0.8}[(CH_2=CH)(CH_3)_2SiO_{1/2}]_{0.2}$;
component (C): an organopolysiloxane (24 parts by weight) with the following structure: $H(CH_3)_2SiO[(C_6H_5)_2Si]OSi(CH_3)_2H$;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

Example 2

The preparation procedures of Example 1 were repeated except for changing the amounts of components (A), (B) and (C) as follows (the amounts of the rest of the components were not changed). Curable organopolysiloxane composition 2 (viscosity: 3,218 mPa·sec) was obtained.

component (A): 13 parts by weight;
component (B): 60 parts by weight; and
component (C): 23 parts by weight.

Example 3

The preparation procedures of Example 1 were repeated except for changing the amounts of components (A), (B) and (C) as follows (the amounts of the rest of the components were not changed). Curable organopolysiloxane composition 3 (viscosity: 3,684 mPa·sec) was obtained.

component (A): 21 parts by weight;
component (B): 53 parts by weight; and
component (C): 22 parts by weight.

Comparative Example 4

The following components were mixed to obtain curable organopolysiloxane composition 4 (viscosity: 2,832 mPa·sec).

component (A): a linear methyl phenyl organopolysiloxane (25 parts by weight; viscosity: 1,675 mPa·sec) capped with dimethyl vinyl groups, with a silicon-bonded phenyl group content of 49.8% by mole and a silicon-bonded vinyl group content of 1.12% by weight;
component (B): an organopolysiloxane (53 parts by weight; solid at 25° C.) with a weight average molecular weight of 1,729, a silicon-bonded phenyl group content of 57% by mole, a silicon-bonded vinyl group content of 4.07% by weight, and the following structure: $(C_6H_5SiO_{3/2})_{0.8}[(CH_2=CH)(CH_3)_2SiO_{1/2}]_{0.2}$;
component (C): an organopolysiloxane (21 parts by weight) with the following structure: $H(CH_3)_2SiO[(C_6H_5)_2Si]OSi(CH_3)_2H$;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

Example 5

The following components were mixed to obtain a curable organopolysiloxane composition 5 (viscosity: 2,720 mPa·sec):

component (A): 7.1 parts by weight;
component (B-1): an organopolysiloxane (66.6 parts by weight; solid at 25° C.) with a weight average molecular weight of 1,312, a silicon-bonded phenyl group content of 52.7% by mole, a silicon-bonded vinyl group content of 4.72% by weight, and the following structure: $(C_6H_5SiO_{3/2})_{0.77}[(CH_2=CH)(CH_3)_2SiO_{1/2}]_{0.23}$;
component (C): an organopolysiloxane (24.2 parts by weight) with the following structure: $H(CH_3)_2SiO[(C_6H_5)_2Si]OSi(CH_3)_2H$;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

Example 6

The following components were mixed to obtain a curable organopolysiloxane composition 6 (viscosity: 2,389 mPa·sec):

component (A): 12.9 parts by weight;
component (A-1): 1.9 parts by weight;
component (B-1): an organopolysiloxane (61.0 parts by weight; solid at 25° C.) with a weight average molecular weight of 1,312, a silicon-bonded phenyl group content of 52.7% by mole, a silicon-bonded vinyl group content of 4.72% by weight, and the following structure: $(C_6H_5SiO_{3/2})_{0.77}[(CH_2=CH)(CH_3)_2SiO_{1/2}]_{0.23}$;
component (C): an organopolysiloxane (22.2 parts by weight) with the following structure: $H(CH_3)_2SiO[(C_6H_5)_2Si]OSi(CH_3)_2H$;
component (D): a complex of Pt and 1,3-divinyl-1,1,3,3-tetramethoxyldisiloxane, used in an amount such that the concentration of Pt was about 1.5 ppm; and component (E): 1-acetenyl-1-cyclohexanol (0.05 parts by weight) for uniformly mixing the components.

Example 7

The following components were mixed to obtain a curable organopolysiloxane composition 7 (viscosity: 2,361 mPa·sec):

component (A-2): 13.1 parts by weight;
component (B-1): an organopolysiloxane (61.8 parts by weight; solid at 25° C.) with an average molecular weight of 1,312, a silicon-bonded phenyl group content of 52.7% by mole, a silicon-bonded vinyl group content of 4.72% by weight, and the following structure: $(C_6H_5SiO_{3/2})_{0.77}$ $[(CH_2=CH)(CH_3)_2SiO_{1/2}]_{0.23}$;
component (C): an organopolysiloxane (22.5 parts by weight) with the following structure: $H(CH_3)_2SiO$ $[(C_6H_5)_2Si]OSi(CH_3)_2H$;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

Example 8

The following components were mixed to obtain a curable organopolysiloxane composition 8 (viscosity: 2,589 mPa·sec):

component (A): 12.9 parts by weight;
component (B-1): an organopolysiloxane (61.0 parts by weight; solid at 25° C.) with an average molecular weight of 1,312, a silicon-bonded phenyl group content of 52.7% by mole, a silicon-bonded vinyl group content of 4.72% by weight, and the following structure: $(C_6H_5SiO_{3/2})_{0.77}$ $[(CH_2=CH)(CH_3)_2SiO_{1/2}]_{0.23}$;
component (C): an organopolysiloxane (22.2 parts by weight) with the following structure: $H(CH_3)_2SiO$ $[(C_6H_5)_2Si]OSi(CH_3)_2H$;
component (C-1): 1.9 parts by weight;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

Example 9

The following components were mixed to obtain a curable organopolysiloxane composition 9 (viscosity: 2,665 mPa·sec):

component (A): 12.9 parts by weight;
component (B-1): an organopolysiloxane (61.0 parts by weight; solid at 25° C.) with an average molecular weight of 1,312, a silicon-bonded phenyl group content of 52.7% by mole, a silicon-bonded vinyl group content of 4.72% by weight, and the following structure: $(C_6H_5SiO_{3/2})_{0.77}$ $[(CH_2=CH)(CH_3)_2SiO_{1/2}]_{0.23}$;
component (C): an organopolysiloxane (22.2 parts by weight) with the following structure: $H(CH_3)_2SiO$ $[(C_6H_5)_2Si]OSi(CH_3)_2H$;
component (C-2): 1.9 parts by weight;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

Example 10

The following components were mixed to obtain a curable organopolysiloxane composition 10 (viscosity: 2,720 mPa·sec):

component (A): 12.9 parts by weight;
component (B-1): an organopolysiloxane (61.0 parts by weight; solid at 25° C.) with an average molecular weight of 1,312, a silicon-bonded phenyl group content of 52.7% by mole, a silicon-bonded vinyl group content of 4.72% by weight, and the following structure: $(C_6H_5SiO_{3/2})_{0.77}$ $[(CH_2=CH)(CH_3)_2SiO_{1/2}]_{0.23}$;
component (C): an organopolysiloxane (22.2 parts by weight) with the following structure: $H(CH_3)_2SiO$ $[(C_6H_5)_2Si]OSi(CH_3)_2H$;
component (C-3): 1.9 parts by weight;
component (D): a complex of Pt and 1,3-divinyl-1,1,3,3-tetramethoxyldisiloxane, used in an amount such that the concentration of Pt was about 1.5 ppm; and
component (E): 1-acetenyl-1-cyclohexanol (0.05 parts by weight) for uniformly mixing the components.

[Cured Product Test]

Curable organopolysiloxane compositions 1-10 prepared by Examples 1-3 and 5-10 and Comparative example 4 were placed in an oven (80° C.) with hot-air circulation respectively for 1 hour. The temperature of the oven was then raised to 150° C. and maintained for 4 hours to obtain cured products. The properties of the obtained cured products were measured by the above measuring method. The results were shown in Table 1-1, Table 1-2, and Table 1-3.

TABLE 1-1

| Property | Example 1 | Example 2 | Example 3 | Comparative example 4 |
|---|---|---|---|---|
| Refractive index | 1.53 | 1.54 | 1.53 | 1.53 |
| Appearance | transparent | transparent | transparent | transparent |
| Transmittance | 98% | 98% | 98% | 95% |
| Hardness (Shore hardness D) | 20 | 60 | 40 | 20 |
| Stickiness of the surface | unsticky | unsticky | unsticky | sticky |
| Transmittance (after being treated at 200° C. for 72 hours) | 92% | 93% | 93% | 73% |

TABLE 1-2

| Property | Example 5 | Example 6 | Example 7 |
|---|---|---|---|
| Refractive index | 1.53 | 1.53 | 1.53 |
| Appearance | transparent | transparent | transparent |
| Transmittance | 98% | 98% | 98% |
| Hardness (Shore hardness A) | 75 | 56 | 53 |
| Transmittance (after being treated at 200° C. for 72 hours) | 91% | 91% | 91% |

TABLE 1-3

| Property | Example 8 | Example 9 | Example 10 |
| --- | --- | --- | --- |
| Refractive index | 1.53 | 1.53 | 1.53 |
| Appearance | transparent | transparent | transparent |
| Transmittance | 98% | 98% | 98% |
| Hardness (Shore hardness A) | 65 | 52 | 54 |
| Transmittance (after being treated at 200° C. for 72 hours) | 91% | 91% | 91% |

As shown in Table 1-1, Table 1-2 and Table 1-3, the cured products from the curable organopolysiloxane compositions of the invention (Examples 1-3 and 5-10) have refractive indexes comparable with that of the cured product from the curable organopolysiloxane composition of the prior art (Comparative example 4), without having a sticky surface. In addition, after being treated at 200° C. for 72 hours, the transmittances and appearances of the cured products from the curable organopolysiloxane compositions of the invention almost remain unchanged. In contrast, the transmittance of the cured product from the curable organopolysiloxane composition of the prior art decreases significantly. It can be seen that the cured product provided by the invention has better heat resistance and thus, much more suitable for use in semiconductor elements such as high efficiency light emitting diodes. Furthermore, it can be seen from the hardness results of Examples 1-3 and 5-10 that the hardness of cured products can be changed by simply adjusting the components and component ratios of the curable organopolysiloxane composition of the present invention, without damaging the excellent fraction rate and transmittance thereof, and thus the applicability of the product is raised.

Given the above, the curable organopolysiloxane composition of the invention can be cured to provide a product with a high refractive index, high transmittance, unsticky surface and good heat resistance and is thus, very suitable for use as an optical material such as the packaging material of light emitting diodes. In addition, the applicability of the curable organopolysiloxane composition of the invention is more extensive because the properties of the cured product can be simply adjusted by regulating the ratio of the components of the composition.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A curable organopolysiloxane composition comprising:
   (A) an organopolysiloxane having at least two silicon-bonded alkenyl groups and having an average unit formula (I):

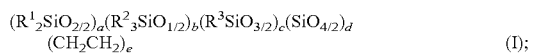

(I);

wherein $R^1$, $R^2$ and $R^3$ are independently a substituted or unsubstituted mono-valent hydrocarbon group, each of $R^1$ is the same with or different from each other, each of $R^2$ is the same with or different from each other, and a>0, b>0, c≥0, d≥0, and e>0, wherein c+d>0;

(B) a branched organopolysiloxane having at least one silicon-bonded alkenyl group and having a siloxane unit of formula $R^4SiO_{3/2}$ wherein $R^4$ is a substituted or unsubstituted mono-valent hydrocarbon group, and wherein the amount of component (B) is about 1 part by weight to about 9900 parts by weight, based on 100 parts by weight of component (A);

(C) an organopolysiloxane having an average unit formula (II) being capped with H:

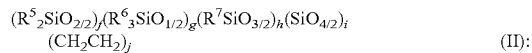

(II):

wherein $R^5$, $R^6$ and $R^7$ are independently H or a substituted or unsubstituted mono-valent hydrocarbon group, wherein each of $R^5$ is the same with or different from each other, each of $R^6$ is the same with or different from each other, f>0, g>0, h≥0, i≥0, j≥0, and the amount of component (C) is about 1 parts by weight to about 300 parts by weight, based on 100 parts by weight of the total amount of components (A) and (B); and (D) a catalyst.

2. The curable organopolysiloxane composition of claim 1, wherein $R^1$, $R^2$, $R^3$, $R^4$, $R^5$, $R^6$ and $R^7$ are independently an alkyl or aryl group.

3. The curable organopolysiloxane composition of claim 1, wherein about 0.1 percent by mole to about 40 percent by mole of $R^1$, $R^2$ and $R^3$ are alkenyl groups, and at least about 10 percent by mole of $R^1$, $R^2$ and $R^3$ are aryl groups, based on the total amount of $R^1$, $R^2$ and $R^3$.

4. The curable organopolysiloxane composition of claim 1, wherein:
   a is an integer ranging from about 1 to about 200;
   b is an integer ranging from about 1 to about 200;
   c is an integer ranging from 0 to about 10;
   d is an integer ranging from 0 to about 5; and
   e is an integer ranging from about 1 to about 100, wherein c+d>0.

5. The curable organopolysiloxane composition of claim 1, wherein component (A) is prepared by an addition reaction of a siloxane having at least two alkenyl groups and a siloxane having at least two H.

6. The curable organopolysiloxane composition of claim 5, wherein:
   the siloxane having at least two alkenyl groups has an average unit formula (III):

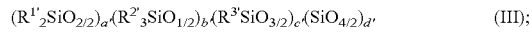

(III);
   and
   the siloxane having at least two H has an average unit formula (IV):

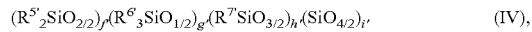

(IV), wherein $R^{1'}$, $R^{2'}$, $R^{3'}$, $R^{4'}$, $R^{5'}$, $R^{6'}$ and $R^{7'}$ are independently a substituted or unsubstituted mono-valent hydrocarbon group, each of $R^{1'}$ is the same with or different from each other, each of $R^{2'}$ is the same with or different from each other, each of $R^{5'}$ is the same with or different from each other, and each of $R^{6'}$ is the same with or different from each other, and a'>0, b'>0, c'≥0, d'≥0, f'>0, g'>0, h'≥0 and i'≥0.

7. The curable organopolysiloxane composition of claim 1, wherein component (B) has at least one silicon-bonded alkenyl group and at least one silicon-bonded aryl group.

8. The curable organopolysiloxane composition of claim 1, wherein about 0.1 percent by mole to about 40 percent by mole of $R^4$ are alkenyl groups, and about at least 10 percent by mole of $R^4$ are aryl groups, based on the total amount of $R^4$.

9. The curable organopolysiloxane composition of claim 1, wherein component (B) has an average unit formula (V):

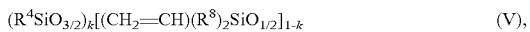
$$(R^4SiO_{3/2})_k[(CH_2\!=\!CH)(R^8)_2SiO_{1/2}]_{1-k} \quad (V),$$

wherein $R^4$ is as defined in claim 1, $R^8$ is independently a substituted or unsubstituted mono-valent hydrocarbon group, each of $R^8$ is the same with or different from each other, and k ranges from about 0.5 to about 0.95.

10. The curable organopolysiloxane composition of claim 9, wherein $R^4$ is a aryl group, $R^8$ is independently an alkyl group with 1 to 8 carbon atoms and k ranges from about 0.6 to about 0.9.

11. The curable organopolysiloxane composition of claim 1, wherein the amount of component (B) is about 200 parts by weight to about 3000 parts by weight, based on 100 parts by weight of component (A).

12. The curable organopolysiloxane composition of claim 11, wherein the amount of component (B) is about 300 parts by weight to about 2500 parts by weight, based on 100 parts by weight of component (A).

13. The curable organopolysiloxane composition of claim 1, wherein about 0.1 percent by mole to about 50 percent by mole of $R^5$, $R^6$ and $R^7$ are H, and at least about 10 percent by mole of $R^5$, $R^6$ and $R^7$ are aryl groups, based on the total amount of $R^5$, $R^6$ and $R^7$.

14. The curable organopolysiloxane composition of claim 1, wherein:
f is an integer ranging from about 1 to about 50;
g is an integer ranging from about 1 to about 50;
h is an integer ranging from 0 to about 10;
i is an integer ranging from 0 to about 5; and
j is an integer ranging from 0 to about 30.

15. The curable organopolysiloxane composition of claim 1, wherein the amount of component (C) is about 10 parts by weight to about 250 parts by weight, based on 100 parts by weight of the total amount of components (A) and (B).

16. The curable organopolysiloxane composition of claim 15, wherein the amount of component (C) is about 15 parts by weight to about 200 parts by weight, based on 100 parts by weight of the total amount of components (A) and (B).

17. The curable organopolysiloxane composition of claim 1, wherein the catalyst of component (D) is selected from the following group: Pt, Rh, Pd, compounds and complexes of the above, and combinations thereof.

18. The curable organopolysiloxane composition of claim 1 for use as a packaging material for light emitting diodes.

19. The curable organopolysiloxane composition of claim 5 for use as a packaging material for light emitting diodes.

* * * * *